United States Patent [19]
Houghton

[11] Patent Number: 5,907,251
[45] Date of Patent: May 25, 1999

[54] LOW VOLTAGE SWING CAPACITIVE BUS DRIVER DEVICE

[75] Inventor: Russell James Houghton, Essex Junction, Vt.

[73] Assignee: International Business Machines Corp., Armonk, N.Y.

[21] Appl. No.: 08/756,196

[22] Filed: Nov. 22, 1996

[51] Int. Cl.⁶ .......................... H03K 17/16; H03K 19/06
[52] U.S. Cl. .......................... 327/108; 327/100; 327/111; 327/306; 327/333; 326/30; 326/26; 326/86
[58] Field of Search ........................ 327/108, 111, 327/382, 165, 100, 297, 306, 317, 319; 326/30, 26, 82, 86

[56] References Cited

U.S. PATENT DOCUMENTS

| | | | |
|---|---|---|---|
| 4,112,512 | 9/1978 | Arzubi et al. | 365/203 |
| 4,363,110 | 12/1982 | Kalter et al. | 365/149 |
| 4,397,002 | 8/1983 | Brosch et al. | 365/190 |
| 4,430,730 | 2/1984 | Tien | 365/149 |
| 4,437,134 | 3/1984 | Dupraz | 361/56 |
| 4,443,882 | 4/1984 | Rolfe et al. | 333/214 |
| 4,673,829 | 6/1987 | Gupta | 241/171 |
| 4,716,313 | 12/1987 | Hori et al. | 326/80 |
| 4,829,479 | 5/1989 | Mitsumoto et al. | 365/189.09 |
| 4,918,341 | 4/1990 | Galbraith et al. | 327/51 |
| 5,018,105 | 5/1991 | Miyanishi | 365/203 |
| 5,050,127 | 9/1991 | Mitsumoto et al. | 365/189.09 |
| 5,198,706 | 3/1993 | Papaliolios | 326/37 |
| 5,199,000 | 3/1993 | Takahashi | 365/189.09 |
| 5,246,439 | 9/1993 | Hebborn et al. | 606/35 |
| 5,293,468 | 3/1994 | Nye et al. | 395/131 |

*Primary Examiner*—Timothy P. Callahan
*Assistant Examiner*—Dinh Le
*Attorney, Agent, or Firm*—William N. Hogg

[57] ABSTRACT

A method and device for driving signals over a capacitive bus is provided. The device comprises at least one input line selectively activatable for receiving an input signal having a first voltage level. A drive capacitor is positioned in series with and between each of the input lines and the capacitive bus to be driven. The drive capacitor and a capacitance of the capacitive bus forms a capacitive divider network which reduces the input signal to render an intermediate signal having a second voltage level less than the first voltage level. Each of the drive capacitors is also provided with a pre-charge input for receiving a pre-charge voltage signal when its corresponding input line is not selectively activated. At least one amplifier is provided for amplifying the intermediate signal to produce an output signal on an output line having a third voltage level which is approximately the same as the first voltage level.

14 Claims, 3 Drawing Sheets

LOW VOLTAGE SWING CAPACITIVE BUS DRIVER DEVICE

FIELD OF THE INVENTION

The present invention relates generally to computer systems and more particularly to driver devices for driving inherently capacitive signal bus lines in such systems.

BACKGROUND OF THE INVENTION

In computer systems signal lines such as data and address lines are typically present which must be driven by driver devices. For example, in conventional integrated circuit (IC) chips, 16 or 32 bit address and data buses are present, and in some advanced microprocessors, data bus widths are sometimes 128 and even 256 bits. These buses are inherently capacitive, the capacitance of which must be overcome by the driver device driving the signal onto these lines. Because capacitance is additive in parallel, as the bus width increases, so does the capacitance.

The capacitance of these signal lines also increases as the length of the lines increases. As IC chips increase in size, then, the problem of designing driver devices for these signal lines becomes more demanding, especially when all of the lines need to be driven simultaneously. Typically, the capacitance of these signal lines is on the order of several picofarads.

FIG. 1 shows a conventional driver device for driving capacitive signal lines. The inputs IN and IN-complement are output by a complementary metal-oxide semiconductor (CMOS) device (not shown). The pair of inverters on each complementary input build up the drive capability of the driver and drive the bus output lines OUT and OUT-complement, both of which have an inherent capacitance $C_{BUS}$. The inverters are typical CMOS inverters comprising a PMOS pull-up transistor and an NMOS pull-down transistor.

When a signal bus is driven in the conventional manner as shown in FIG. 1, the OUT and OUT-complement bus lines experience a voltage swing which represents the change in voltage on a bus line during a transition when it is driven from a high to low voltage. The voltage swing on these bus lines is equal to the external voltage supply (e.g., 3.3 volts). The charge required to be built up by the CMOS inverters of FIG. 1 to effectively drive the bus lines OUT and OUT-complement is equal to this voltage swing multiplied by the capacitance of the bus ($C_{BUS}$). Accordingly, the required charge increases with both increased supply voltage and increased bus capacitance.

Typically, these bus lines need to be driven in a very short time frame, on the order of one or two nanoseconds, and thus the current that must be provided by the CMOS driver device increases with decreased driving times. Merely increasing the voltage supply of the device driver is not an acceptable solution, however, because the increased voltage results in a larger voltage swing which increases the charge necessary to drive the bus, and, hence the input power requirements. Moreover, an increase in noise is typically an undesirable by-product of an increased voltage supply due to the increased transient currents experienced during voltage transitions.

One known solution of the capacitive bus driving problem is shown in an article entitled "Sub-1-V Swing Internal Bus Architecture for Future Low-Power ULSI's", *IEEE Journal of Solid State Circuits*, Vol. 28, April 1993. The disclosed solution relates to a technique for reducing the voltage swing on a capacitive bus to reduce input power requirements. Using on-chip regulators, two internal voltages are generated, both of which reside at levels between ground and the supply voltage on the bus to be driven. The differential between these two internally generated voltages is about one-half volt. A conventional CMOS inverter is operated between these voltages, rather than between the supply voltage and ground, as shown in the prior art driver device of FIG. 1, to reduce the voltage swing present on the bus to be driven. Hence, the power requirements are also reduced.

It is an object of the present invention, then, to provide a driver device for driving signals such as the address and data lines of a capacitive bus, which does not require the internal generation and regulation of additional voltage levels, but which reduces the power consumption required for operating the driver and minimizes noise due to transient currents produced during its operation.

SUMMARY OF THE INVENTION

A method and device for driving signals over a capacitive bus is provided. The device comprises at least one input line selectively activatable for receiving an input signal having a first voltage level. A drive capacitor is positioned in series with and between each of the input lines and the capacitive bus to be driven. The drive capacitor and a capacitance of the capacitive bus forms a capacitive divider network which reduces the input signal to render an intermediate signal having a second voltage level less than the first voltage level. Each of the drive capacitors is also provided with a pre-charge input for receiving a pre-charge voltage signal when its corresponding input line is not selectively activated. At least one amplifier is provided for amplifying the intermediate signal to produce an output signal on an output line having a third voltage level which is approximately the same as the first voltage level.

DETAILED DESCRIPTION OF THE PREFERRED EMBODIMENT

Figures 1, 2:
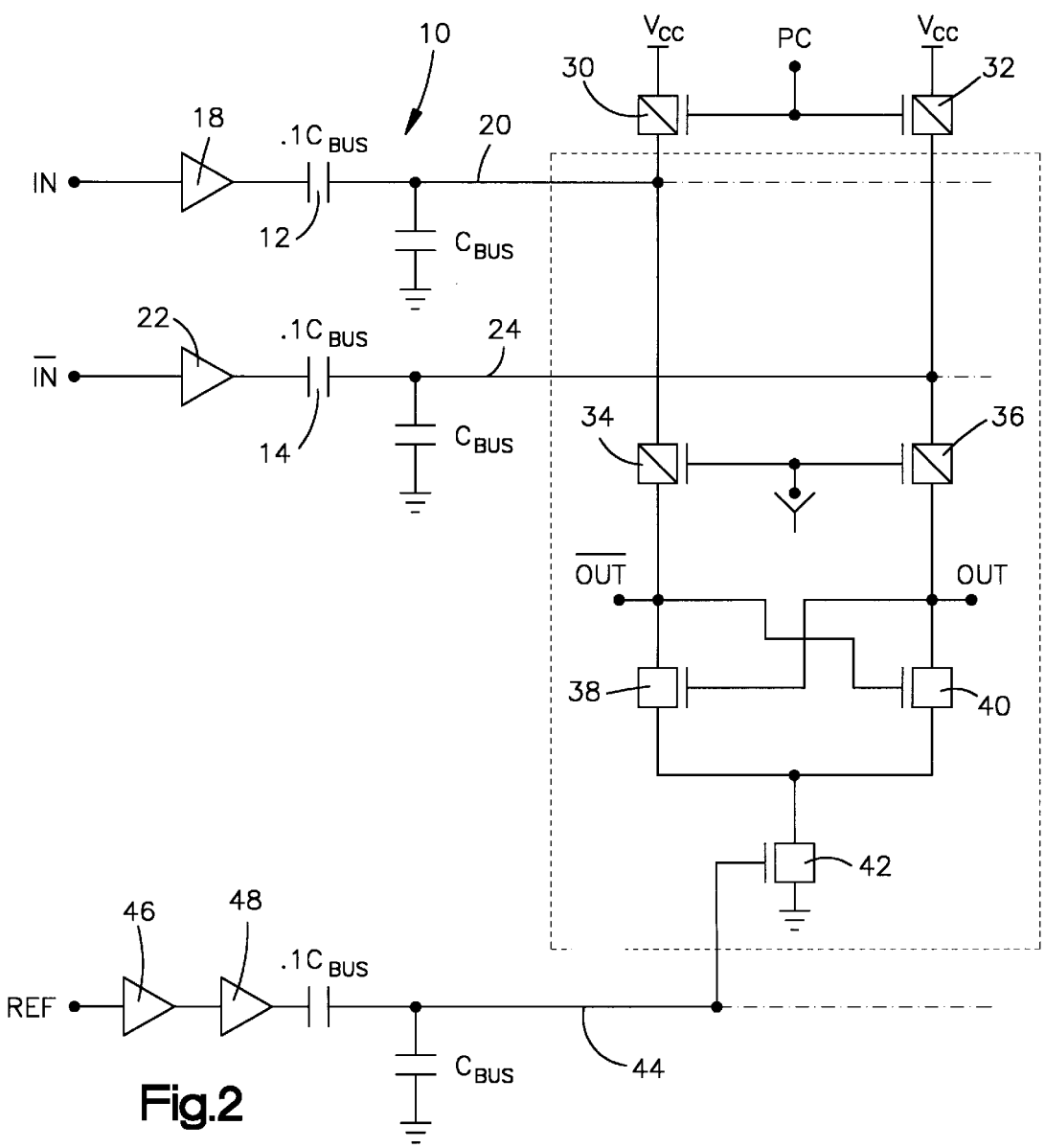
FIG. 1 shows a conventional driver device for driving capacitive signal lines.
FIG. 2 shows a driver device for driving capacitive signal lines, constructed according to the principles of the present invention.

FIG. 2 shows a driver device 10 for driving capacitive signal lines, such as data and address bus lines, constructed according to the principles of the present invention. The inventive driver device shown in FIG. 2 improves upon the prior art circuit of FIG. 1 by the addition of drive capacitors 12 and 14 and an amplifier circuit 16.

The drive capacitors 12 and 14 are, in the preferred embodiment, 10% or 0.1 of the value of capacitance $C_{BUS}$. If, for example, the value of $C_{BUS}$ is 10 picofarads, then the capacitive value of capacitors 12 and 14 is 1 picofarad. Capacitor 12 is inserted in series between conventional CMOS inverter 18 and capacitive bus line 20, and capacitor 14 is inserted in series between conventional CMOS inverter 22 and capacitive bus line 24.

The internal supply voltage $V_{CC}$ is approximately three (3.0) volts. Thus, in operation, each capacitor 12 and 14 (0.1

$C_{BUS}$) is driven through the voltage range of zero (ground) to 3 volts. These capacitors each form a capacitive divider network along with the capacitance $C_{BUS}$ of bus lines 20 and 24, respectively. The capacitance of each divider network is (0.1 $C_{BUS}$)/($C_{BUS}$+0.1 $C_{BUS}$)=0.09 $C_{BUS}$.

Accordingly, although the drive capacitors 12 and 14 experience the full voltage swing of the CMOS inverter of 3 volts during a logic level transition, their respective bus lines 20 and 24 experience a change in voltage of only 0.09×3 volts, which is approximately 90% less than the input voltage of 3.0 volts or 270 millivolts (0.27 volts). As noted above, the charge required to be built up by the CMOS inverters is equal to the voltage swing multiplied by the capacitance of the bus ($C_{BUS}$). Thus, by reducing the voltage swing to only 9% of the voltage swing experienced by the capacitive bus lines of the prior art circuit of FIG. 1, the charge or current required to drive these bus lines is proportionately reduced.

Because 0.27 volts is insufficient, however, to drive circuits operating at CMOS levels at receiving points along the capacitive bus line 24, the driver device 10 of FIG. 2 includes the amplifier circuit 16 and bus pre-charge P-type field effect transistors (PFETs) 30 and 32. The amplifier circuit includes PFETs 34 and 36, and N-type field effect transistors (NFETs) 38, 40 and 42. The function of the amplifier circuit is to amplify the 0.27 volts back up to a full 3 volt swing. Thus, using the circuit of FIG. 2, the capacitive bus lines 20 and 24 are driven at a reduced swing, and this reduced swing voltage is subsequently amplified to achieve the initial full voltage swing to effectively drive data and signals into circuits needing CMOS levels.

Within amplifier circuit 16, NFETs 38 and 40 are shown in cross-coupled configuration. This cross-coupled configuration forms the amplification mechanism of the amplifier circuit 16. The gates of NFETs 38 and 40 provide the CMOS OUT and OUT-complement levels corresponding to the data of capacitive bus lines 20 and 24, respectively.

A timing line 44 is provided for selectively activating the amplifier formed by NFETs 38 and 40. As shown in FIG. 2 by the dashed lines extending capacitive bus lines 20 and 24 and timing line 44, more than one amplifier circuit 16 may be used in connection with capacitive bus lines 20 and 24. For example, if data is to be received and locally driven at different points on a bus, a particular amplifier circuit may be used at a given location on the bus.

In series with the timing line 44 is a pair of inverters 46 and 48 which drive a reference signal along the timing line through a full voltage swing because no corresponding drive capacitor is present on this timing line. The reference signal is used to activate the gate of set transistor (NFET) 42, the drain of which is connected to the sources of NFETs 38 and 40, to activate the amplifier formed thereby. The source of NFET 42 is connected to ground. NFET 42 acts as a gate for turning on and off the amplifier formed by cross-coupled NFETs 38 and 40. When the IN and IN-complement signals are driven, a reference timing signal (REF) is simultaneously driven to enable the appropriate amplifier circuit 16.

If more than one amplifier circuit 16 is used to receive data from the bus at more than one bus location, means must be provided for selectively activating the desired amplifier 16. A decoder (not shown) provides a selection means for selectively activating device 42 of the appropriate amplifier circuit 16. PFETs 34 and 36 are isolation transistors controlled by node Y which serve to disconnect the selected amplifier from the bus during activation of device 42 to prevent current through these devices from additionally discharging bus 20 or 24.

Inverter 48 provides a delay for the reference signal as it promulgates along timing line 44 to activate NFET 42. The delay in the reference signal provided by the second inverter 48 allows time for the bus signal transferred through PFET devices 34 and 36 to be fully developed at nodes OUT and OUT-complement before the reference signal activates NFET 42.

The gates of PFETs 30 and 32 are tied (electrically shorted) together at node PC (pre-charge). The voltage supply $V_{CC}$ (three volts) is connected to the source of each of the PFETs 30 and 32. The drains of these PFETs 30 and 32 are connected to, respectively, the capacitive bus lines 20 and 24. The drains serve as a bus pre-charge when the PFETs 30 and 32 are activated by node PC to pre-charge the capacitance of the bus $C_{BUS}$ to the supply voltage $V_{CC}$. The pre-charge hold the bus at the supply voltage level $V_{CC}$ when data is not being driven over the bus, and releases the bus when data is being driven over the bus.

The sources of PFETs 34 and 36 are also connected to the bus lines 20 and 24, respectively. The drain of PFET 34 is connected to the OUT-complement node of amplifier 16, the drain of NFET 38, and the gate of NFET 40. The drain of PFET 36 is connected to the OUT node of amplifier 16, the drain of NFET 40, and the gate of NFET 38.

In operation, when data is not being driven over the bus, the pre-charge input PC is activated, thereby energizing PFETs 30 and 32 to pre-charge capacitive bus lines 20 and 24 to the supply voltage $V_{CC}$. When data is desired to be driven over capacitive bus lines 20 and 24, the pre-charge input PC is deactivated, and the appropriate amplifier circuit 16 is selected by the decoder circuit, activating NFET 42. Activating node Y thereby disconnects PFETs 34 and 36 from the bus while the amplifier circuit 16 is active.

Data is driven through the full $V_{CC}$ voltage swing through the IN and IN-complement lines. The drive capacitors 12 and 14 experience the full voltage swing of the CMOS inverter of 3 volts, but their respective bus lines 20 and 24 experience a change in voltage of only 0.27 volts.

Simultaneously with the driving of the IN and IN-complement lines, the reference timing signal is driven. As explained above the propagation of this reference signal is delayed by inverter 48 which allows time for data on buses 20 and 24 to develop on nodes OUT and OUT-complement. NFET 42 is activated by the reference timing signal, which in turn, activates the amplifier formed by cross-coupled NFETs 38 and 40. The amplifier 16 amplifies the reduced 0.27 volt IN and IN-complement signals and outputs corresponding output signals OUT and OUT-complement having a full $V_{CC}$ voltage swing.

Figure 3:
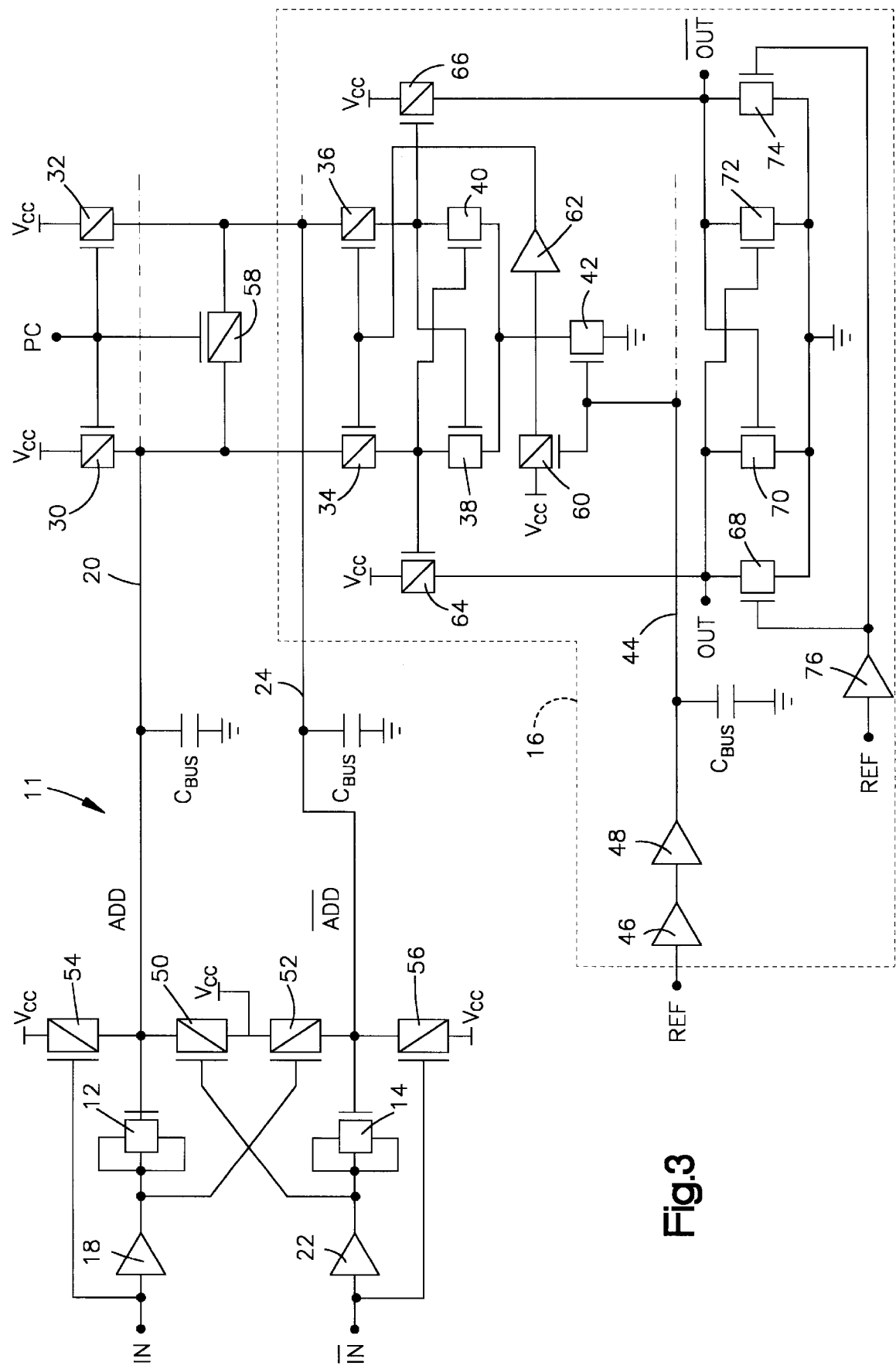
FIG. 3 is second embodiment of the driver device of FIG. 1, used for driving capacitive address bus lines.

FIG. 3 shows a second embodiment of the invention for use in connection with an address bus, wherein the capacitive bus 20 is an ADD bus line and capacitive bus 24 is an ADD-complement bus line. The circuit 11 of FIG. 3 operates in a similar manner as that of FIG. 2, and like components are designated with the same reference numerals. Similar to the circuit of FIG. 2, the ADD and ADD-complement bus lines represent the reduced 0.27 volt IN and IN-complement signals, and output signals OUT and OUT-complement experience a full $V_{CC}$ voltage swing.

In this embodiment, drive capacitors 12 and 14 are implemented as NFETs having their source and drain tied together. Cross-coupled PFETs 50 and 52 aid in driving the ADD and ADD-COMPLEMENT bus lines. In addition, PFETs 54 and 56 have their sources connected to voltage supply $V_{CC}$, their gates connected to the IN and IN-complement inputs, respectively, and their drains connected to the ADD and ADD-complement lines, respectively.

The amplifier circuit 16 is also modified in the circuit 11 of FIG. 3, as compared to the circuit 10 in FIG. 2. Additional PFET 58 has its gate connected to the pre-charge (PC) input and its source and drain connected to the ADD and ADD-complement bus lines, respectively. PFET 58 serves to facilitate equalizing of the ADD and ADD-complement bus lines.

Also in FIG. 3, the amplifier selection input at node Y is provided directly from timing line 44 through PFET 60 and inverter 62. Hence, both the timing line and the amplifier selection line are driven simultaneously. In addition, an output drive buffer circuit is provided by PFETs 64 and 66; NFETs 68, 70, 72 and 74; and inverter 76.

Figure 4:
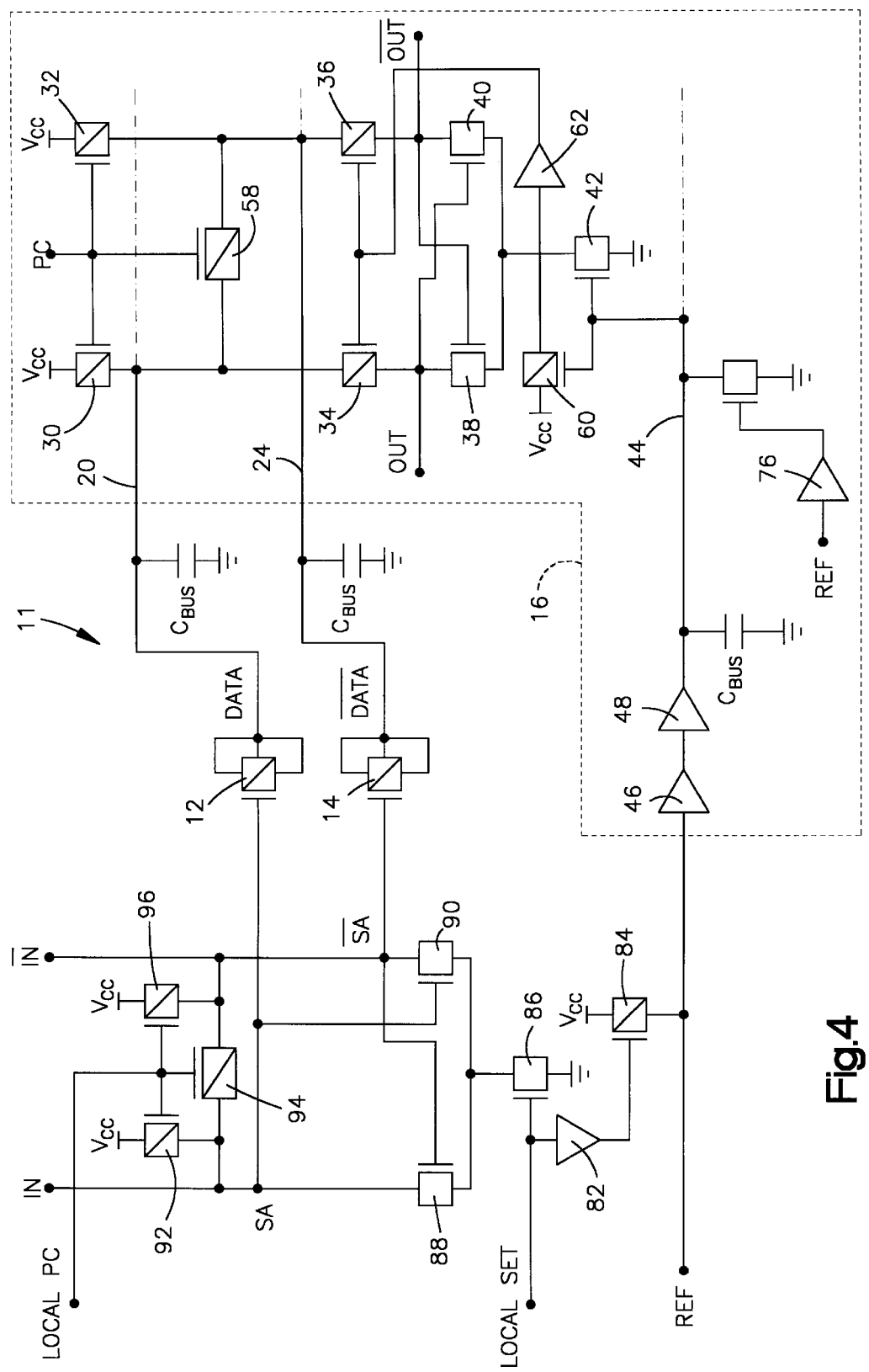
FIG. 4 is third embodiment of the driver device of FIG. 1, used for driving capacitive data bus lines.

FIG. 4 shows a third embodiment of the inventive circuit 13 for use in connection with a data bus, wherein the capacitive bus line 20 is a DATA bus line and capacitive bus line 24 is a DATA-complement bus line. The circuit of FIG. 4 operates in a similar manner as that of FIG. 3, and analogous components are designated with the same reference numerals. In FIG. 4, the DATA and DATA-complement bus lines represent the reduced 0.27 volt IN and IN-complement signals, and output signals OUT and OUT-complement experience a full $V_{CC}$ voltage swing.

The circuit 13 of FIG. 4 is used to drive a data bus, for example, on a memory IC chip. On such memory IC chips, typically data locations are arranged in array blocks. Each of the array blocks has a local data amplifier 80 associated therewith to amplify the data coming from the array block, and to drive the data onto data bus lines 20, 24 which are common to all of the array blocks. Although shown in FIG. 4 with only one local data amplifier 80, it is to be understood that a plurality of such amplifiers may be "dot OR'd" at the data bus lines DATA and DATA-complement and selectively activated.

Data appears from the array block at the IN and IN-complement inputs as a small offset voltage. This data must then be driven over the DATA and DATA-complement bus lines 20 and 24 both of which have a capacitance $C_{BUS}$. When the data appears at the IN and IN-complement inputs, a local set input activates the reference timing signal (REF) through inverter 82 and PFET 84. Simultaneously, the local set input also activates, through set transistor (NFET) 86, the amplifier mechanism in data amplifier 80 formed by NFETs 88 and 90. In addition, an additional pre-charge circuit (local PC) is provided for each data amplifier 80, comprising PFETs 92, 94 and 96.

Accordingly, when the local set input activates the data amplifier 80, the data amplifier amplifies the small offset voltage representing the data to output a full $V_{CC}$ voltage swing, which is applied to the inputs of PFET drive capacitors 12 and 14. Similar to the circuits shown in FIGS. 2 and 3, the drive capacitors reduce the full voltage swing to 0.27 volts, and the amplifier circuit 16 amplifies the reduced 0.27 volt DATA and DATA-complement signals and outputs corresponding output signals OUT and OUT-complement having a full $V_{CC}$ voltage swing.

As explained above, the pre-charge circuitry operates to hold the bus at the supply voltage level $V_{CC}$ when data is not being driven over the bus, and releases the bus when data is being driven over the bus. Accordingly, when a particular data amplifier 80 is not being activated, the SA and SA-complement nodes are held at $V_{CC}$ through their associated drive pre-charge PFETs 92, 94 and 96. Only the amplifier 80 corresponding to the selected array block is being activated to drive data, and thus its local pre-charge circuit is inactive. The selected amplifier 80 attempts to drive the voltage of the bus lines 20, 24 in the negative direction, from the pre-charge voltage of 3 volts, to 0.27 volts lower than the pre-charge voltage (i.e., 2.73 volts).

Because all of the capacitors 12 and 14 in each of the array blocks are formed from non-linear PFET capacitors having their sources and drains tied together, the capacitors do not achieve a capacitance until a certain threshold voltage level is met. This condition only occurs in a selected amplifier 80 as the voltage at either node SA or SA-complement falls to a PFET threshold below the precharge voltage of bus 20 or 24, respectively. Accordingly, no capacitance develops over the drive capacitors 12 and 14 for the unselected data array blocks.

Thus, during the pre-charge condition for these unselected array blocks, when data is not being driven and the gates of the PFETs 92, 94 and 96 are set at the pre-charge voltage, the capacitors 12 and 14 are not capacitive. That is, there is no capacitance between the gate and the common source-drain for these capacitors. Hence, the bus lines 20, 24 do not experience the effect of cumulative capacitive loading which would otherwise be present with the drive capacitors at all of the unselected array blocks, if the drive capacitors were linear and not pre-charged.

Accordingly, the preferred embodiment of a driver device, for driving capacitive signal lines, has been described. With the foregoing description in mind, however, it is understood that this description is made only by way of example, that the invention is not limited to the particular embodiments described herein, and that various rearrangements, equivalents, modifications and substitutions may be implemented without departing from the scope of the invention as hereinafter claimed.

I claim:

1. A method of driving a bus having a capacitance, comprising:

driving an input signal to a first voltage level;

reducing the first voltage level to a second voltage level which is less than the first voltage level by inputting the first voltage level into a capacitive divider network to produce the second voltage level;

pre-charging the second voltage level to the first voltage level when the input signal is not being driven; and amplifying the second voltage level to produce a signal output having a third voltage level which is approximately the same as the first voltage level.

2. The method of claim 1, wherein said step of reducing the first voltage level comprises the step of reducing the first voltage level by approximately 90%.

3. The method of claim 1, wherein the step of amplifying the second voltage level further comprises the steps of providing an amplifier and selectively activating and deactivating the amplifier.

4. A device for driving a signal over a capacitive bus, said device comprising:

a driving means receiving said signal for generating an output signal of a first voltage level;

a drive capacitor coupled between said driving means and the capacitive bus, the drive capacitor and a capacitance of the capacitive bus forming a capacitive divider network which transforms the first voltage level into a second voltage level less than the first voltage level;

a pre-charging circuit for pre-charging the second voltage level to the first voltage level when the signal is not being driven; and at least one amplifier coupled to said pre-charging circuit and said drive capacitor for amplifying the second voltage level to produce a signal output having a third voltage level which is approximately the same as the first voltage level.

5. The device of claim 4, wherein the drive capacitor has a capacitance of approximately 10% of a value of the capacitance of the capacitive bus.

6. The device of claim 4, wherein the at least one amplifier comprises a pair of cross-coupled transistors.

7. The device of claim 4, wherein the at least one amplifier comprises a plurality of amplifiers, each of which is selectively enabled by an external decoder circuit.

8. The device of claim 4, further comprising a reference timing circuit for enabling the at least one amplifier.

9. A device for driving signals over a capacitive data bus which is shared by a plurality of data array blocks, said device comprising:

a plurality of driving means respectively receiving signals from the plurality of data array blocks, each of the signals having a first voltage level;

a plurality of drive capacitors each of which is coupled between a driving means of said plurality of driving means and the capacitive bus, each of the drive capacitors and a capacitance of the capacitive bus forming a capacitive divider network which transforms the first voltage level into a second voltage level less than the first voltage level, each of the drive capacitors is configured for receiving a pre-charge voltage signal when its input is not activated;

a plurality of pre-charging circuits, each of which pre-charging the second voltage level to the first voltage level when its input signal is not being driven; and at least one amplifier coupled to each of said plurality of pre-charing circuits and each of said plurality of drive capacitors for amplifying the second voltage level to produce a signal output having a third voltage level which is approximately the same as the first voltage level.

10. The device of claim 9, wherein each of the drive capacitors comprises a field effect transistor having the source and drain coupled together.

11. The device of claim 10, wherein each of the drive capacitors has a capacitance value of approximately 10% of a capacitance value of the capacitive bus.

12. The device of claim 9, wherein the at least one amplifier comprises a pair of cross-coupled transistors.

13. The device of claim 9, wherein the at least one amplifier comprises a plurality of amplifiers, each of which is selectively enabled by an external decoder circuit.

14. The device of claim 9, further comprising a reference timing circuit for enabling the amplifier.

* * * * *